(12) United States Patent
Wang

(10) Patent No.: US 6,199,627 B1
(45) Date of Patent: Mar. 13, 2001

(54) HEAT SINK

(75) Inventor: Steven Wang, Pan-Chiao (TW)

(73) Assignee: Hon Hai Precision In. Co., Ltd., Taipei Hsien (TW)

( * ) Notice: Subject to any disclaimer, the term of this patent is extended or adjusted under 35 U.S.C. 154(b) by 0 days.

(21) Appl. No.: 09/336,133

(22) Filed: Jun. 18, 1999

(30) Foreign Application Priority Data

Dec. 4, 1998 (TW) ................................................ 87220290

(51) Int. Cl.$^7$ ........................................................ F28F 7/00
(52) U.S. Cl. ............................................ 165/185; 165/80.3
(58) Field of Search ...................................... 361/697, 703; 165/185, 80.3; 257/722, 718; 174/16.3

(56) References Cited

U.S. PATENT DOCUMENTS

| | | | |
|---|---|---|---|
| 4,122,508 | * | 10/1978 | Rumbaugh ............................ 361/697 |
| 4,449,578 | * | 5/1984 | Munekawa ........................ 165/104.33 |
| 4,777,560 | * | 10/1988 | Herrell et al. ........................ 165/80.3 |
| 5,020,586 | * | 6/1991 | Mansingh ............................ 165/80.3 |
| 5,396,403 | * | 3/1995 | Patel ..................................... 361/713 |
| 5,654,587 | * | 8/1997 | Schneider et al. ................... 165/80.3 |
| 5,701,951 | * | 12/1997 | Jean ..................................... 165/80.3 |
| 5,777,259 | * | 7/1998 | Mennucci et al. ................... 165/80.3 |
| 5,947,192 | * | 9/1999 | Kuo ..................................... 165/80.3 |
| 6,062,301 | * | 5/2000 | Lu ....................................... 165/80.3 |
| 6,076,594 | * | 6/2000 | Kuo ..................................... 165/80.3 |

\* cited by examiner

*Primary Examiner*—Ira S. Lazarus
*Assistant Examiner*—Tho Van Duong
(74) *Attorney, Agent, or Firm*—Wei Te Chung

(57) ABSTRACT

A heat sink includes a number of primary fin plates and a number of secondary spacing plates alternately arranged and fixed together by fasteners extending therethrough. Bottom edges of the plates are flush with each other to form a surface positionable on a heat generating component. Top edges of the primary plates are located above top edges of the secondary plates. Upper portions of the primary plates are formed between the top edges thereof and the top edges of the secondary plates. A number of openings are defined in the upper portion of each primary plate to increase the surface area thereof. The openings may be grooves or slots. Positioning bosses are formed on a first face of each plate for reception in recesses defined in a second face of an adjacent plate thereby properly positioning the plates with respect to each other.

1 Claim, 7 Drawing Sheets

HEAT SINK

BACKGROUND OF THE INVENTION

1. Field of the Invention

The present invention generally relates to a heat sink for removing heat from a heat generating component, and in particular to a heat sink suitable for automated production with reduced costs.

2. The Prior Art

Electronic devices or components, such as a central processing unit of a computer, which generate heat during operation require a heat removing device such as a heat sink in order to maintain a proper operational temperature. Several different types of heat sinks available such as those disclosed in U.S. Pat. Nos. 4,884,331 and 5,038,858 and Taiwan Patent Application No. 85212486 which are respectively shown in FIGS. 1, 2 and 3 of the attached drawings.

In FIG. 1, a heat sink 60 made by aluminum extrusion is shown. The heat sink 60 requires sawing and surface finishing to obtain the final product, which is a tedious and laborious process. Furthermore, the ratio of the height h of the fins to the distance d between adjacent fins is limited to a maximum value of 13:1. Thus, improvement of the heat removal rate of the heat sink is limited.

A heat sink 70 comprising a base 74 defining a plurality of grooves 76 for receiving and retaining fins 72 therein is shown in FIG. 2. The heat sink 70 overcomes the problems encountered by the heat sink 60 illustrated in FIG. 1, but the heat removal rate is adversely affected by gaps 78 inevitably existing between the fins 72 and the base 74.

FIG. 3 shows a folded-fin heat sink 80 constructed by folding a thin conductive plate to form a number of spaced fin panels joined by connecting sections 82. The connecting sections 82 are positioned to physically contact a base 84. Due to manufacturing tolerances, gaps often exist between the connecting sections 82 and the base 84 thereby creating a heat transfer barrier and minimizing the heat removal efficiency of the heat sink 80.

It is thus desirable to have a heat sink which overcomes the disadvantages associated with the conventional heat sinks.

SUMMARY OF THE INVENTION

Accordingly, an object of the present invention is to provide a heat sink suitable for automated mass production with reduced costs.

Another object of the present invention is to provide a heat sink for efficiently dissipating heat from a heat generating electronic component.

To achieve the above objects, a heat sink in accordance with the present invention comprises a number of primary fin plates and a number of secondary spacing plates alternately arranged and fixed together by fasteners extending therethrough. Bottom edges of the plates are flush with each other to form a surface positionable on a heat generating component. Top edges of the primary plates are positioned above top edges of the secondary plates. Upper portions of the primary plates are formed between the top edges thereof and the top edges of the secondary plates. A number of openings are defined in the upper portion of each primary plate to increase the surface area thereof. The openings may be grooves or slots. Positioning bosses are formed on a first face of each plate for reception in recesses defined in a second face of an adjacent plate thereby properly positioning the plates with respect to each other.

BRIEF DESCRIPTION OF THE DRAWINGS

The present invention will be apparent to those skilled in the art by reading the following description of preferred embodiments thereof, with reference to the accompanying drawings, in which.

DETAILED DESCRIPTION OF THE PREFERRED EMBODIMENTS

Figure 1:
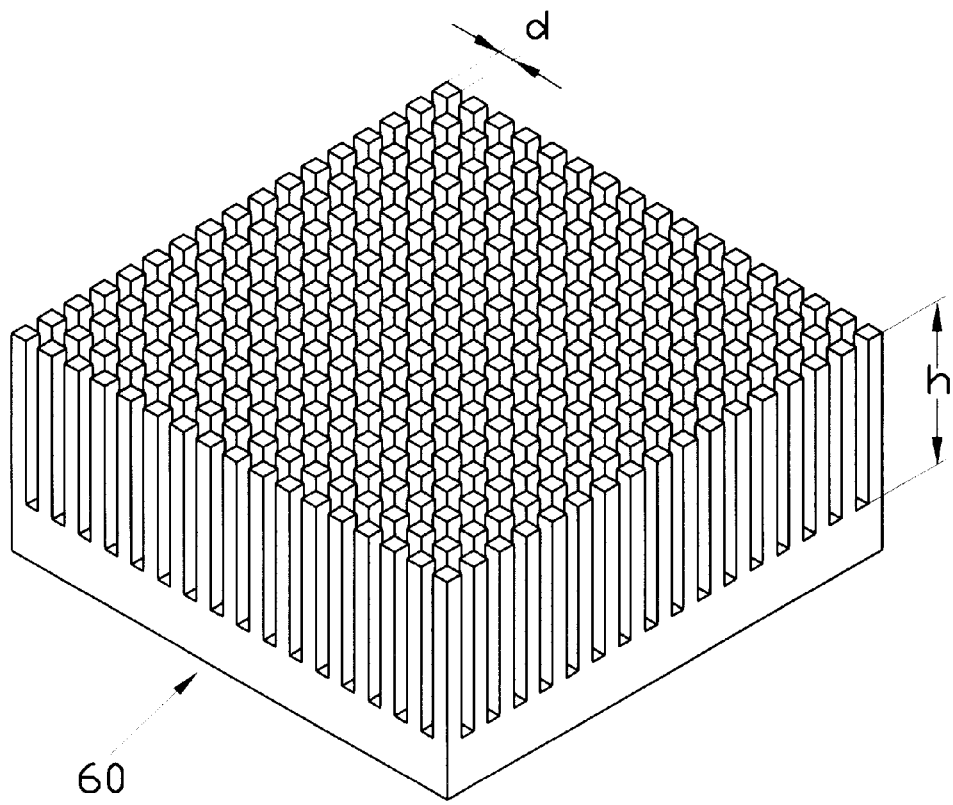
FIG. 1 is a perspective view of a first conventional heat sink.
Figure 2:
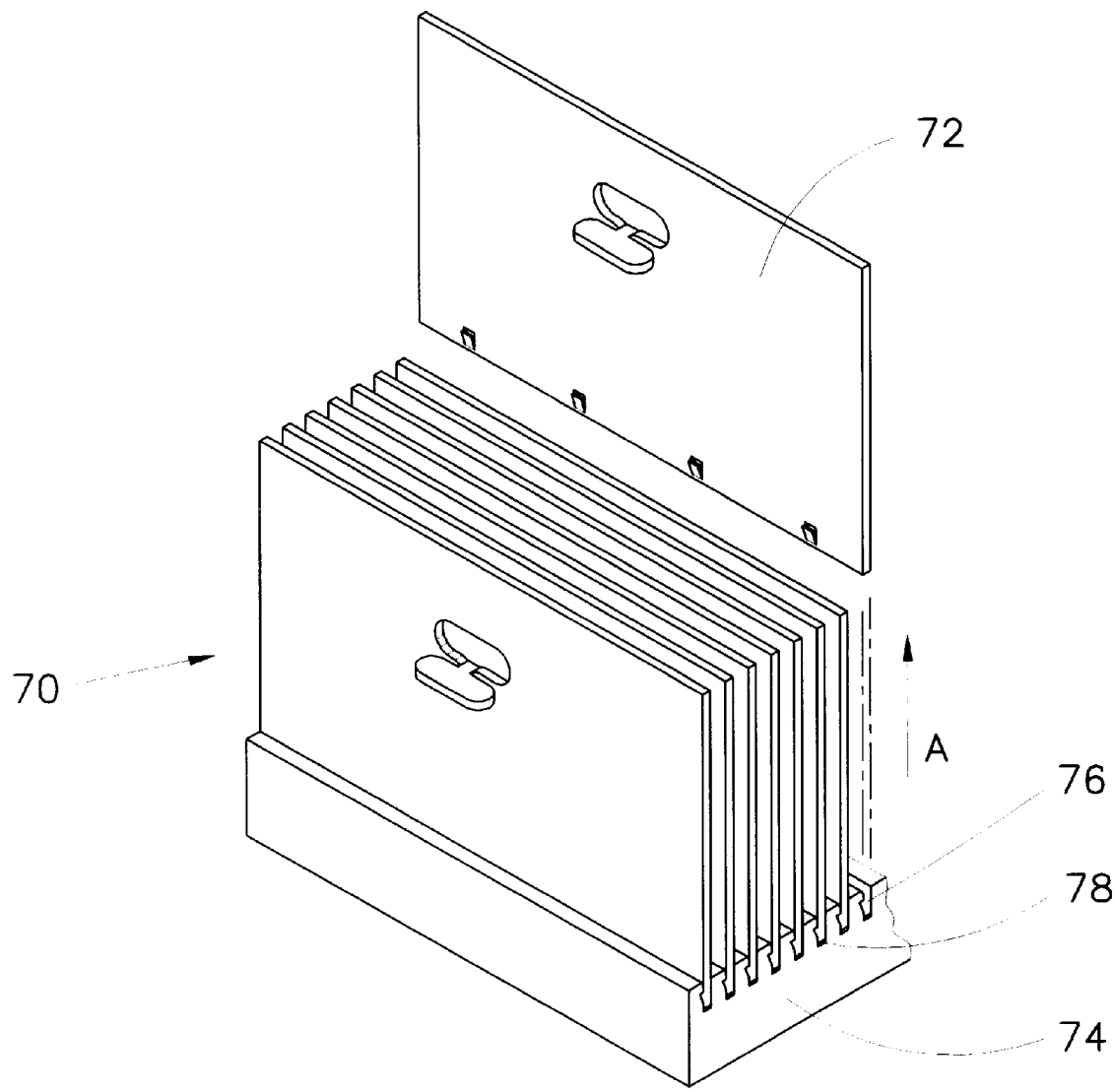
FIG. 2 is an exploded view of a second conventional heat sink.
Figure 3:
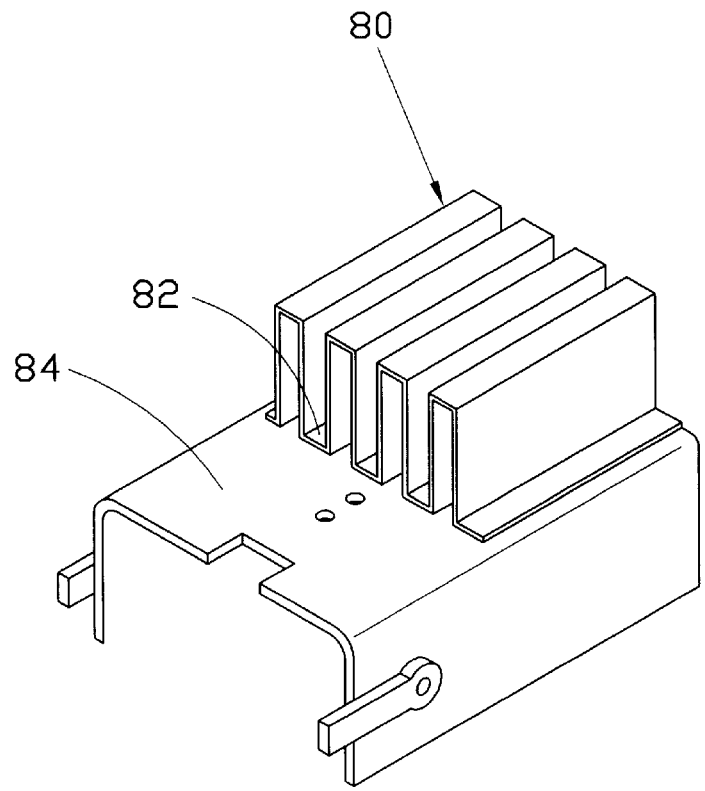
FIG. 3 is a perspective view of a third conventional heat sink.
Figure 4:
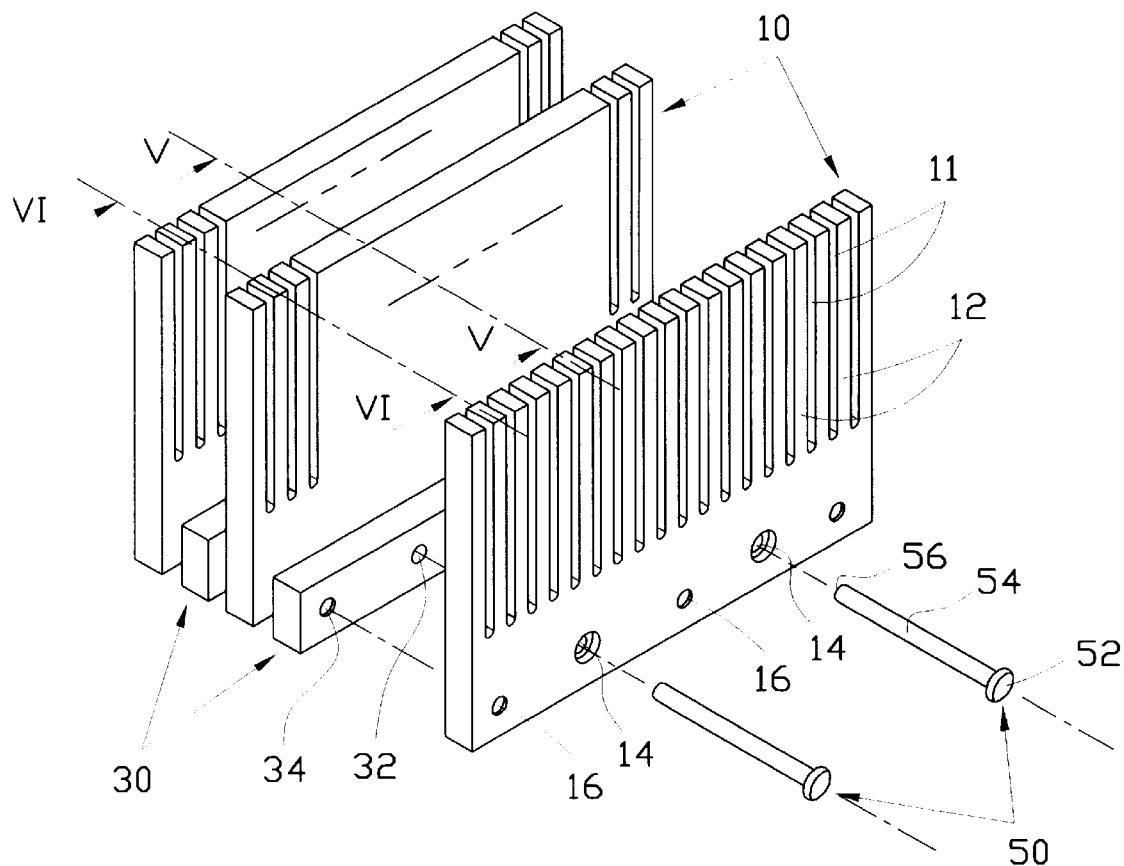
FIG. 4 is an exploded view of a heat sink constructed in accordance with a first embodiment of the present invention.

Referring to the drawings and in particular to FIG. 4, a heat sink constructed in accordance with a first embodiment of the present invention comprises a plurality of primary fin plates 10 and a plurality of secondary spacing plates 30 alternately arranged with respect to each other. Both the primary and secondary plates 10, 30 are thermally conductive. The primary and secondary plates 10, 30 are fixed together to form a stack with bottom edges thereof flush with each other to form a surface positionable on a heat generating component (not shown) for removing heat therefrom.

Each primary plate 10 has a considerably greater height than the height of each secondary plate 30 whereby top edges of the primary plates 10 are positioned above top edges of the secondary plates 30. An upper portion of each primary plate 10 is formed between the top edge thereof and the top edge of the secondary plate 30. A lower portion of the primary plate 10 is sandwiched between the secondary plates 30. Each primary plate 10 defines at least one opening in the upper portion for increasing the surface area thereof.

Figure 5:
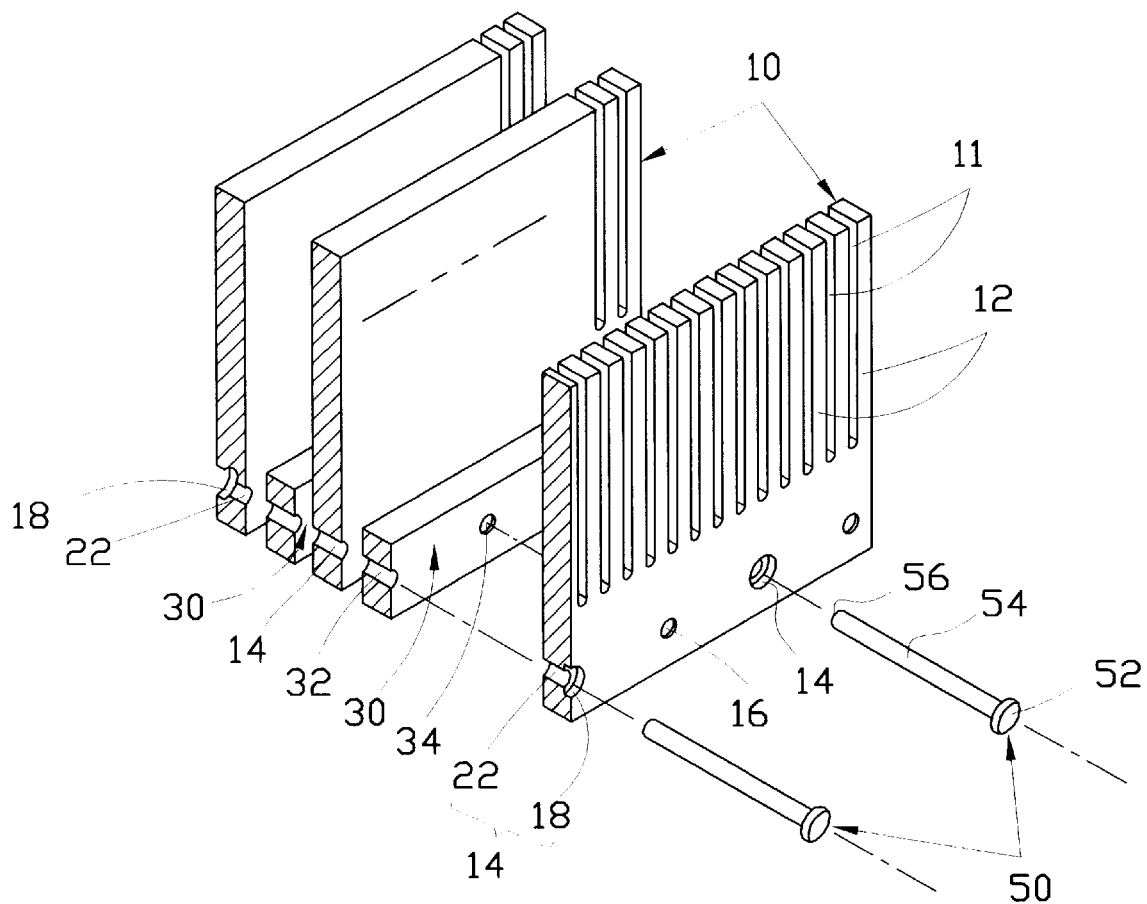
FIG. 5 is similar to FIG. 4 showing a partially cut away view along line V—V thereof.
Figure 6:
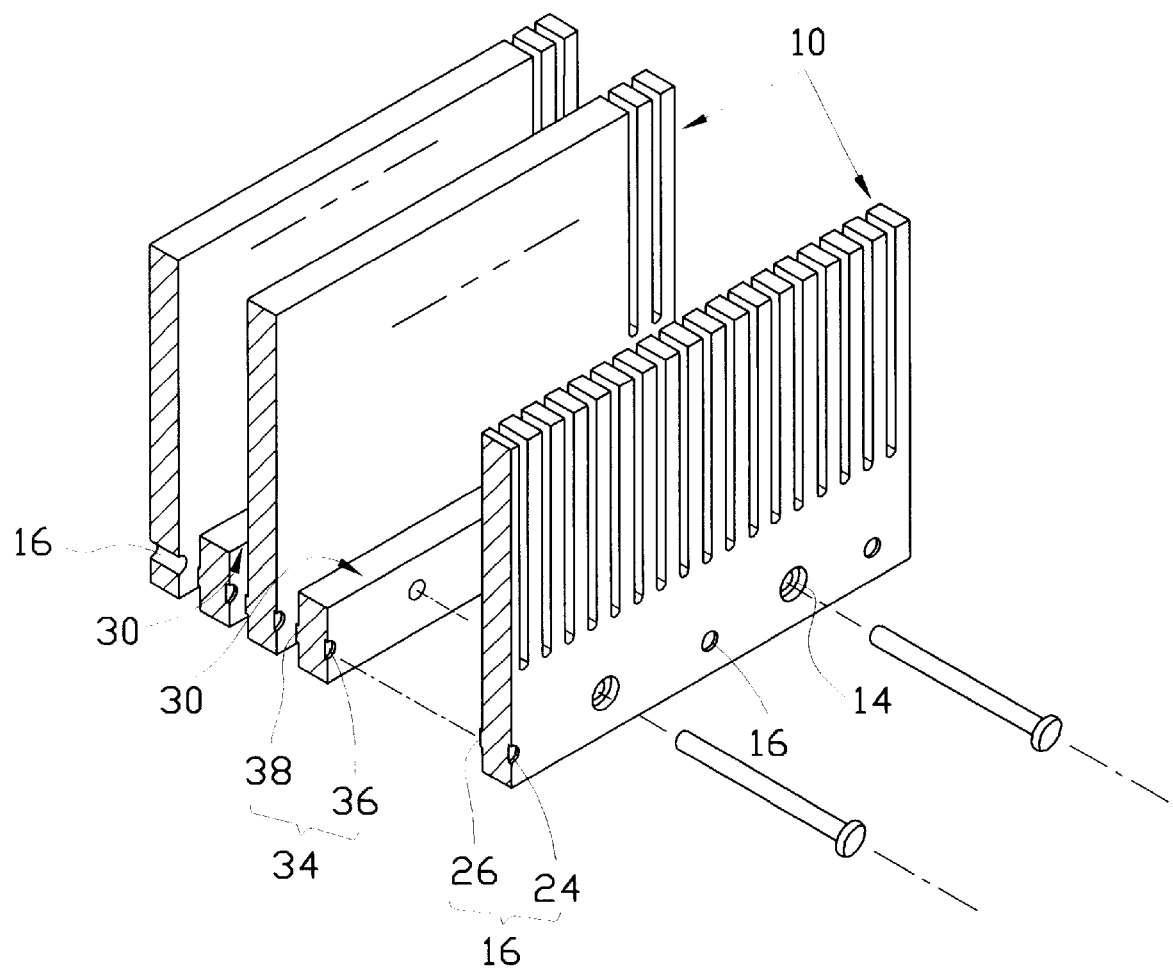
FIG. 6 is similar to FIG. 4 showing a partially cut away view along line VI—VI thereof.
Figure 7:
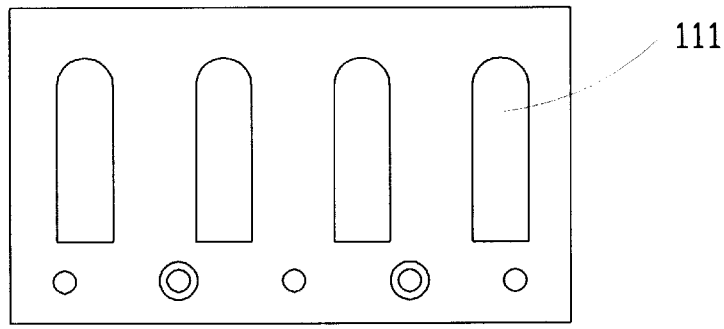
FIG. 7 is a side elevational view of a primary plate of a heat sink constructed in accordance with a second embodiment of the present invention.
Figure 8:
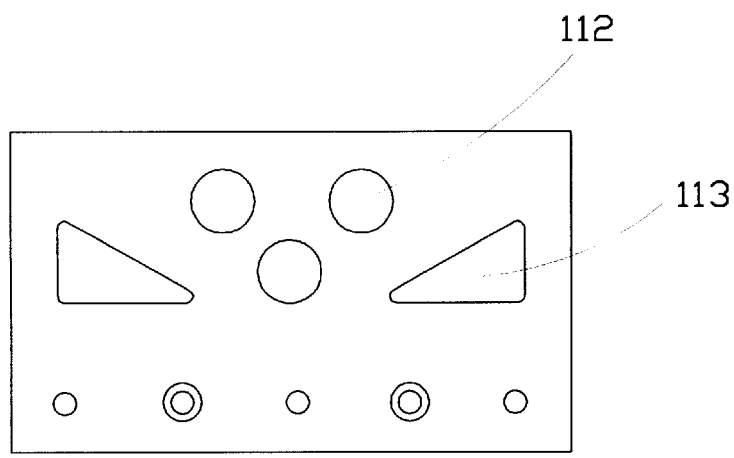
FIG. 8 is a side elevational view of a primary plate of a heat sink constructed in accordance with a third embodiment of the present invention.

Referring to FIGS. 5 and 6, each primary plate 10 defines a plurality of openings in the form of grooves 11 with columns 12 extending therebetween. As seen in FIG. 7, the openings can be a number of elongate slots 111 defined in each primary plate 10, while the embodiment of FIG. 8 forms a number of circular openings 112 and triangular slots 113 defined in the primary plate 10.

Through holes 14, 32 are respectively defined in the primary and secondary plates 10, 30 for receiving fasteners 50 to secure the primary and secondary plates 10, 30 together. The fasteners 50 can be rivets. Preferably, the through holes 14, 32 of the outer plates 10, 30 of the stack are sink bores. In the embodiment illustrated, the outer plates are primary plates 10. The through holes 14 of the outer primary plates 10 comprise a reduced bore 22 and an expanded bore 18. Corresponding thereto, each fastener 50 has an expanded head 52 received in the expanded bore 18 of one the outer primary plates 10 and an elongate body 54 extending through the reduced bore 22 and the through holes 32, 14 of the remaining plates 30, 10 of the stack. A free end 56 of each fastener 50 extends through the expanded bore 18 of the other outer primary plate 10 and is then deformed to occupy the excess space of the expanded bore 18 thereby securing the plates 10, 30 together.

Preferably, the plates 10, 30 comprise positioning means 16, 34 for properly positioning the plates 10, 30 with respect to each other. The positioning means 16, 34 comprises bosses 26, 38 formed on a first face of the plates 10, 30 and corresponding recesses 24, 36 defined on a second face of the plates 10, 30, respectively. The bosses 26, 38 of the plates 10, 30 are received in the recesses 36, 24 of the adjacent plates 10, 30. Preferably, the bosses 26, 38 and the corresponding recesses 24, 36 of the same plate are formed by means of pressing thereby simplifying the manufacturing process of the heat sink.

Preferably, the positioning means 16 of one of the outer primary plates 10 is a simple hole for receiving the boss 38 of the positioning means 34 of the adjacent secondary plate 30 to form a flat second face of the last primary plate 10.

Although the present invention has been described with reference to preferred embodiments, it is apparent to those skilled in the art that a variety of modifications and changes may be made without departing from the scope of the present invention which is intended to be defined by the appended claims.

What is claimed is:

1. A heat sink comprising a number of primary plates having a lower portion and an upper portion, and a number secondary plates alternately arranged with the primary plates, the secondary plates being fixed to the lower portions of the primary plates, bottom edges of the primary and secondary plates being flush with each other to define a surface adapted to be positioned on a heat generating component to remove heat therefrom; wherein through holes are defined in the lower portions of the primary plates and the secondary plates for the extension of fasteners therethrough to secure the plates together; and wherein the through holes defined in two outer plates which are located at terminal sides of the alternately arranged plates are sink bores, and wherein each fastener has an expanded head received in the corresponding sink bore of one of the outer plates and a free end extending through and deformed in the corresponding sink bore of the other outer plate.

* * * * *